(12) United States Patent
Mendez Hernandez et al.

(10) Patent No.: US 8,395,279 B2
(45) Date of Patent: Mar. 12, 2013

(54) SHADOW DETECTION APPARATUS USING FIBER OPTICS FOR SOLAR-BASED POWER GENERATION PLANTS

(75) Inventors: Yaru Najem Mendez Hernandez, Bavaria (DE); Oliver Mayer, Bayern (DE); Marcus Zettl, Bayern (DE); Omar Stern, Bavaria (DE); Toby Ferenczi, London (GB); Michael Schmidt, Bayern (DE)

(73) Assignee: General Electric Company, Niskayuna, NY (US)

( * ) Notice: Subject to any disclaimer, the term of this patent is extended or adjusted under 35 U.S.C. 154(b) by 91 days.

(21) Appl. No.: 13/160,762

(22) Filed: Jun. 15, 2011

(65) Prior Publication Data

US 2012/0062037 A1 Mar. 15, 2012

(51) Int. Cl.
 *H02J 3/14* (2006.01)
(52) U.S. Cl. .......................................... 307/31
(58) Field of Classification Search ............ 307/31; 136/244, 246
 See application file for complete search history.

(56) References Cited

U.S. PATENT DOCUMENTS

| | | | |
|---|---|---|---|
| 4,491,727 A | 1/1985 | Appelbaum et al. | |
| 5,255,170 A | 10/1993 | Plamp et al. | |
| 5,501,743 A * | 3/1996 | Cherney | 136/248 |
| 6,730,840 B2 | 5/2004 | Sasaoka et al. | |
| 6,858,791 B2 | 2/2005 | Erban | |
| 7,915,523 B2 * | 3/2011 | Farhadieh | 136/259 |
| 2002/0030153 A1 | 3/2002 | Matsuyama | |
| 2010/0295377 A1 | 11/2010 | Sok et al. | |
| 2011/0037600 A1 | 2/2011 | Takehara et al. | |
| 2011/0220091 A1 * | 9/2011 | Kroyzer | 126/572 |
| 2012/0138123 A1 * | 6/2012 | Newdoll et al. | 136/246 |

FOREIGN PATENT DOCUMENTS

WO WO 2010048589 4/2010

OTHER PUBLICATIONS

William Grise and Dr. Charles Patrick, Passive Solar Lighting Using Fiber Optics, Journal of Industrial Technology, vol. 19, No. 1—Nov. 2002 to Jan. 2003, pp. 1-7, National Association of Industrial Technology.

Lijun Gao, Roger A. Doougal, Shengyi Liu, Albena P. Iotova, Parallel-Connected Solar PV System to Address Partial and Rapidly Fluctuating Shadow Conditions, University of South Carolina Scholar Commons, Faculty Publications Electrical Engineering Department of, Published in IEEE Transactions on Industrial Electronics, vol. 56, 2009, pp. 1548-1556.

* cited by examiner

*Primary Examiner* — Daniel Cavallari
(74) *Attorney, Agent, or Firm* — Paul J. DiConza

(57) ABSTRACT

A solar-based power generation system may include an array of components responsive to solar radiance. The components may be disposed over respective locations on a field. The system may further include a plurality of optical fibers having respective first ends coupled to the array of components and arranged to receive solar radiance. The plurality of optical fibers may have respective second ends arranged to output respective optical signals indicative of respective levels of solar radiance over the respective locations of the field. Opto-electrical circuitry may be coupled to receive the respective optical signals from the plurality of optical fibers and generate a respective signal indicative of a shadow condition present over at least one or more of the respective locations of the field.

20 Claims, 3 Drawing Sheets

SHADOW DETECTION APPARATUS USING FIBER OPTICS FOR SOLAR-BASED POWER GENERATION PLANTS

FIELD OF INVENTION

The present invention is generally related to solar-based power generation, and, more particularly, to apparatus to detect solar radiance variation (e.g., shadows) that may be experienced by an array of components of such systems.

BACKGROUND OF THE INVENTION

Large-scale generation of electric power from solar energy continues progressing as an attractive modality for clean and efficient generation of electric power, such as may be generated from a freely-available and essentially inexhaustible source of energy, the Sun.

In the case of direct conversion of solar radiation to electricity, the solar-based power generation system may include a solar (e.g., a photovoltaic (PV)) array, which is a linked collection of solar modules. A solar module in turn is made-up of multiple interconnected solar cells or so-called strings. The cells directly convert solar energy into direct current (DC) electricity via the photovoltaic effect.

The output power of a solar module is approximately proportional to the level of solar irradiance to which the module is exposed. It will be appreciated, that in certain applications, such as solar power plants, building-integrated PV systems, etc., the photovoltaic modules may be subject to non-uniform solar illumination or so-called radiation. Possible causes of non-uniform solar radiation may be solar radiance obscuration (e.g., shadows) due to clouds, neighboring trees and/or man-made structures, soiling, etc. Regardless of the specific cause, shadowing of a solar module may result in a degraded performance of the module. For example, the characteristics of the current-voltage (I-V) and power-voltage (P-V) curves of the solar module may be substantially affected by the level of solar irradiance to which the module is exposed. Moreover, a shadowed solar cell could be detrimentally affected since a shadowed cell may behave like a load (i.e., it may draw current), which could lead to the formation of undesirable hot spots. It will be appreciated that suboptimal performance resulting from shadows is not limited to systems involving direct-conversion components. For example, indirect-conversion systems involving components, such as solar collectors may also be affected by the presence of shadows.

It is known to use pyranometers for measuring solar radiance. Pyranometers are thermally-responsive devices, and consequently may be relatively sluggish in their response. For example, pyranometers may not be suitable for accurately detecting rapid solar radiance fluctuations, such as may occur due to moving clouds. It is also known to use PV sensors for measuring solar radiance. A PV sensor may consist of a solar cell, whose output power may be dependent on the operating temperature of the solar cell, which means that temperature sensing may be needed to offset thermal effects. Additionally, although PV sensors may have a faster response than pyranometers, PV sensors tend to be less accurate in their measurements than pyranometers.

In view of the foregoing considerations, it would be desirable to provide a reliable, accurate, relatively fast-response and low-cost apparatus to determine a presence of shadows in solar-based power generation systems.

BRIEF DESCRIPTION

Aspects of the present invention may be fulfilled by a solar-based power generation system, as may include an array of components responsive to solar radiance. The components may be disposed over respective locations on a field. The system may further include a plurality of optical fibers having respective first ends coupled to the array of components and arranged to receive solar radiance. The plurality of optical fibers may further have respective second ends arranged to output respective optical signals indicative of respective levels of solar radiance over the respective locations of the field. Opto-electrical circuitry may be coupled to receive the respective optical signals from the plurality of optical fibers and generate a respective signal indicative of a shadow condition present over at least one or more of the respective locations of the field. A controller may be responsive to the respective signal from the opto-electrical circuitry and configured to perform a control strategy for the array of components taking into account the shadow condition present over the one or more of the respective locations of the field.

Further aspects of the present invention may be fulfilled by apparatus to determine a presence of shadows in a solar-based power generation system having an array of components responsive to solar radiance. The components may be disposed over respective locations on a field. The apparatus may include a plurality of optical fibers having respective first ends coupled to the array of components and arranged to receive solar radiance. The plurality of optical fibers may have respective second ends arranged to output respective optical signals indicative of respective levels of solar radiance over the respective locations of the field. Opto-electrical circuitry may be coupled to receive the respective optical signals from the plurality of optical fibers and generate a respective signal indicative of a shadow condition present over at least one or more of the respective locations of the field.

Yet further aspects of the present invention may be fulfilled by a solar-based power generation system, which may include an array of photovoltaic modules disposed over respective locations on a field. The system may further include a plurality of optical fibers having respective first ends coupled to the array of photovoltaic modules and arranged to receive solar radiance. The plurality of optical fibers may have respective second ends to output respective optical signals indicative of respective levels of solar radiance over the respective locations of the field. A photodetector device may be responsive to the respective optical signals from the plurality of optical fibers. A processor may be coupled to the photodetector device to process respective photodetector output signals and generate a respective signal indicative of a shadow condition present over at least one or more of the respective locations of the field. A controller may be responsive to the respective signal from the processor and configured to perform a control strategy for the array of photovoltaic modules taking into account the shadow condition present over the one or more of the respective locations of the field.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
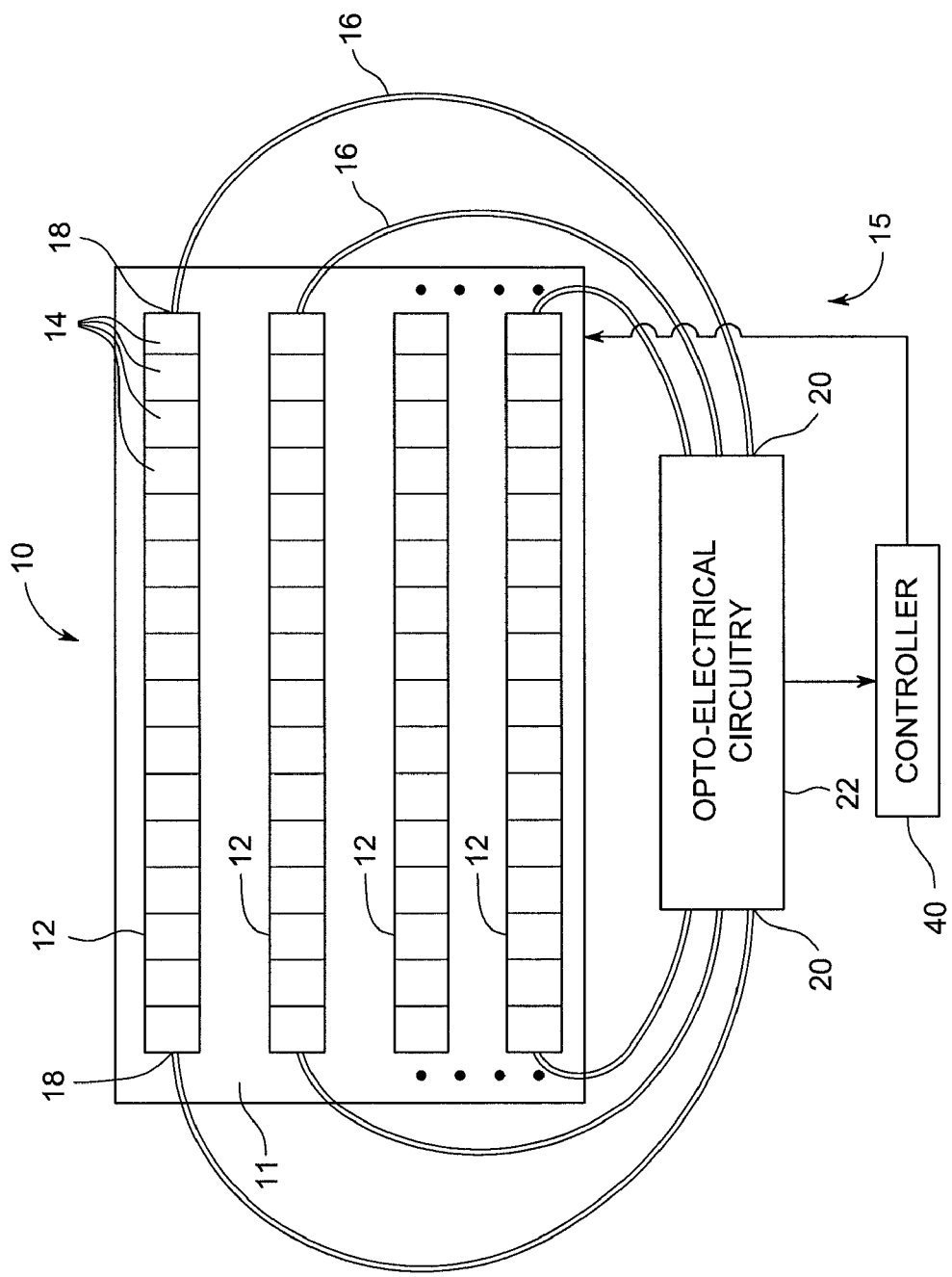
FIG. 1 is a schematic representation of an example solar-based power generation system (e.g., utility-scale PV plant) including an example embodiment of an apparatus for detecting solar radiance variation (e.g., shadows) in accordance with aspects of the present invention.

FIG. 1 is a schematic representation of an example embodiment of a solar-based power generation system 10, such as may be used for generating electric power from solar energy. System 10 may include an array of components responsive to solar radiance, such as an array of photovoltaic (PV) modules or strings 12, each of which may be made up of multiple interconnected solar cells 14. The components are disposed over respective locations (e.g., spaced-apart locations) on a field 11, such as an utility-scale solar farm, as may involve a relatively large surface area (e.g., potentially hundreds of acres).

As will be readily appreciated by one skilled in the art, PV modules 12 may be connected in series circuit (strings) to obtain a desired voltage, and then respective strings of such serially-connected PV modules may be connected in parallel circuit to one another to obtain a desired current. One or more electronic converters (e.g., inverters, not shown) may be utilized to convert DC power produced by the totality of the connected PV modules into grid-compatible alternating current (AC).

Example embodiments of the present invention may include a potentially cost-effective and reliable apparatus 15 for detecting solar radiance variation (e.g., shadows) that may affect one or more components (e.g., PV modules 12) of system 10. It will be appreciated that aspects of the present invention are not limited just to systems involving components capable of directly converting solar radiation to electricity. For example, aspects of the present invention may be readily applied to any solar-based power generation system, such as may involve components for indirect conversion of solar radiation to electricity, heat or cooling systems, such as solar thermal collectors.

Example systems that could benefit from aspects of the present invention may be photovoltaic systems, concentrated photovoltaic systems, solar thermal collectors and the like. Accordingly, the foregoing description directed to a solar-based power generation system involving PV modules should be construed in an example sense and not in a limiting sense.

In one example embodiment, PV modules 12 may include a plurality of optical fibers 16 arranged to obtain solar radiance measurements indicative of shadowing conditions. In one example embodiment, respective first ends 18 of the fibers may be exposed to receive solar radiance to output at respective second ends 20 of the fibers respective optical signals indicative of respective levels of solar radiance over the respective locations of the field.

In one example embodiment, optical fibers 16 may be coupled to opto-electrical circuitry 22 to appropriately acquire, condition and process the respective optical signals from optical fibers 16 to determine whether a shadow condition may be present over at least one or more of the respective locations of the field.

It will be appreciated that the number of optical fibers 16 that may be coupled to the array of components may be selected to provide any desired spatial resolution for the solar radiance measurements over field 11. Accordingly, it will be appreciated that aspects of the present invention are not limited to any number of optical fibers per PV module. Additionally, although FIG. 1, illustrates respective first ends 18 of optical fibers 16 located at opposite longitudinal ends of the PV modules or racking system, it will be appreciated that aspects of the present invention are not limited to any specific location for the respective first ends 18 of optical fibers 16. In one example embodiment, the respective first ends 18 of optical fibers 16 may be arranged proximate a periphery of field 11. Accordingly, the number and/or location of optical fibers illustrated in FIG. 1 and FIG. 2 should be construed in an example sense and not in a limiting sense.

Figure 2:
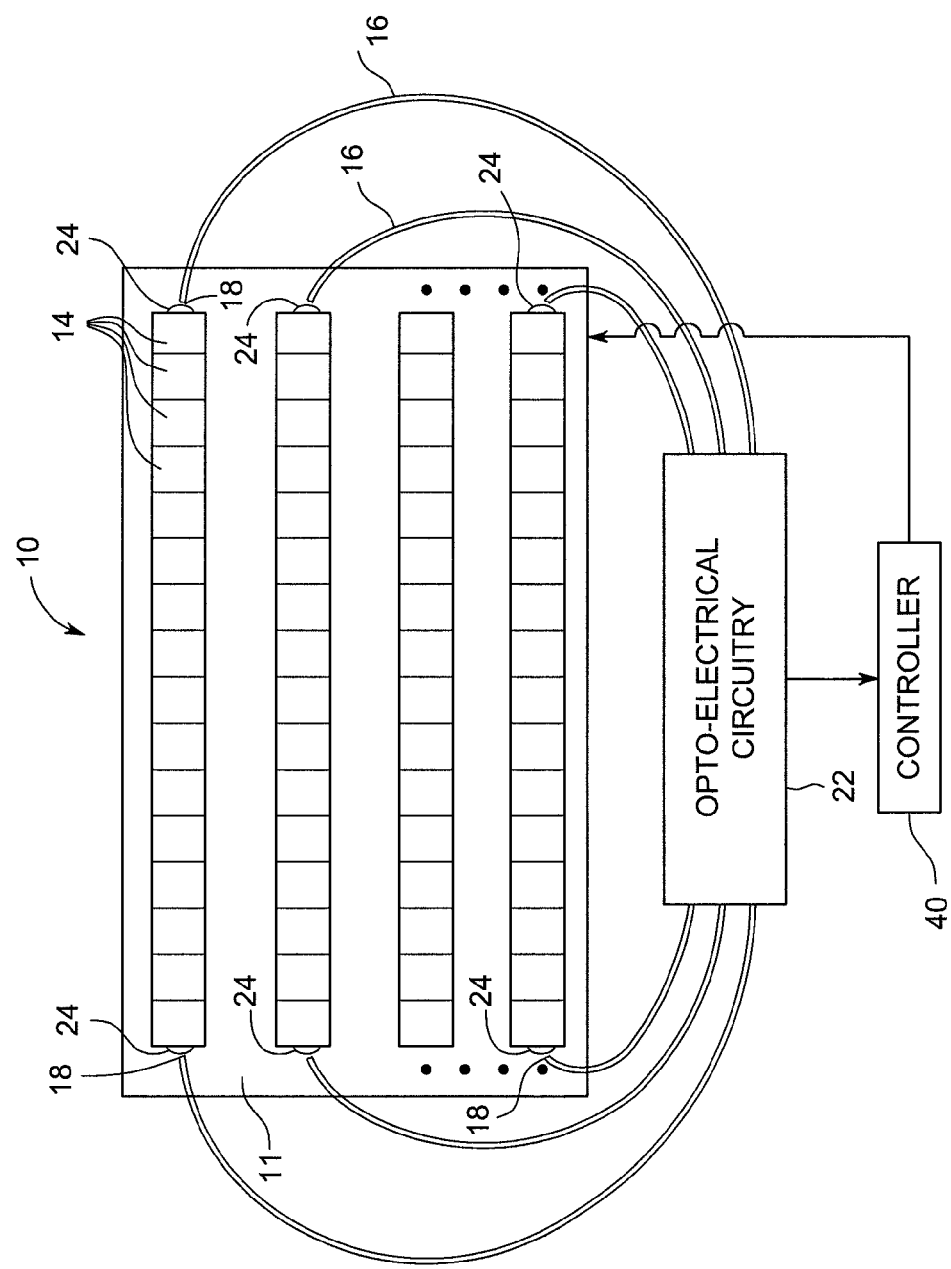
FIG. 2 is a schematic representation showing another example embodiment of apparatus for detecting solar radiance variation in accordance with aspects of the present invention.

In the example embodiment shown in FIG. 2, a plurality of magnifying lenses 24 may be optically coupled to the respective first ends 18 of the plurality of optical fibers 16 to facilitate an efficient transfer of solar radiance into the optical fibers. This may be an example option suitable for climate regions (e.g., latitudes) exposed to generally lower levels of solar irradiance.

Figure 3:
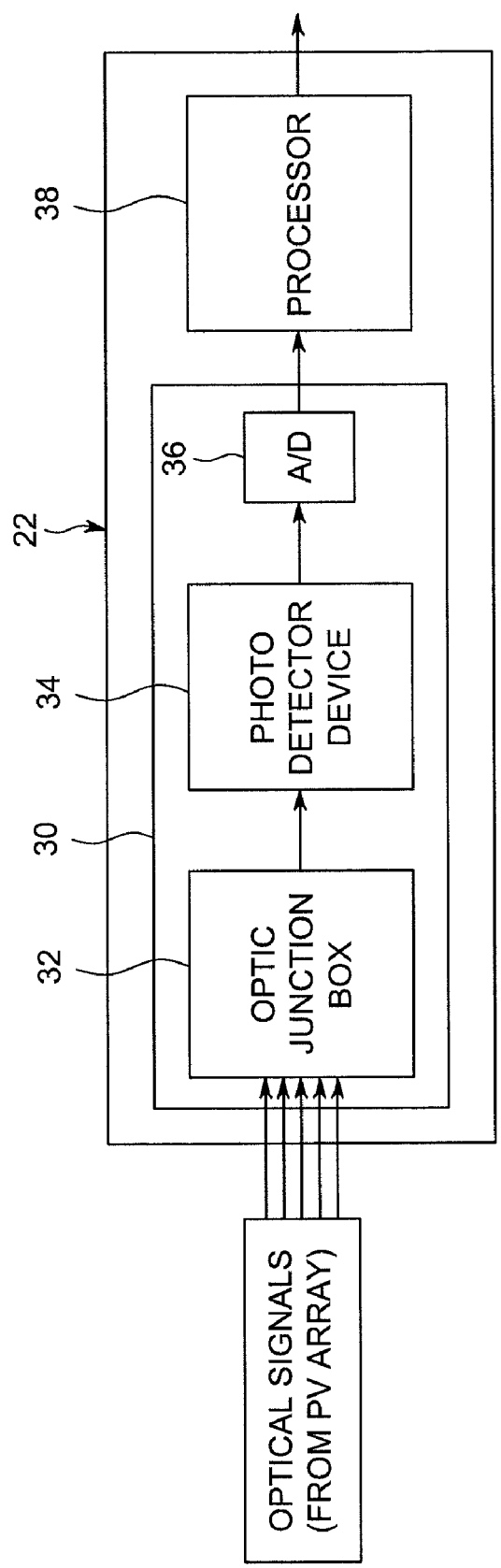
FIG. 3 is a block diagram representation of one example embodiment of opto-electrical circuitry as may be part of an apparatus for detecting solar radiance variation in accordance with aspects of the present invention.

FIG. 3 is a block diagram representation of one example embodiment of opto-electrical circuitry 22, as may include a data acquisition (DAQ) unit 30, such as a multi-channel DAQ unit to acquire and condition the optical signals from the plurality of optical fibers 16. In one example embodiment, DAQ unit 30 may include a main optical junction box 32 coupled to the respective second ends of the plurality of optical fibers. A photo detector device 34, as may include one or more photodetectors, may be arranged to receive the respective optical signals from the plurality of optical fibers coupled to junction box 32. It will be appreciated by one skilled in the art that standard multiplexing techniques may be readily used to reduce the number of photodetectors employed in photodetector device 34. For example, a single photodetector may be responsive to optical signals from multiple optical fibers sequentially sampled at respective time intervals.

An analog-to-digital converter 36 may be used to convert the analog output signals from photodetector device 34 to respective digital signals. A processor 38 may be coupled to process the digitized photodetector output signals and generate a respective indication of a shadow condition present over at least one or more of the photovoltaic modules. Processor 38 may be configured to uniquely associate a given optical signal with a respective PV module and/or string of the power generation plant. This association may be established with any desired level of granularity, such as may allow identifying a respective PV module region and/or string region, which may be experiencing a shadowing condition.

It will be appreciated that opto-electrical circuitry 22 may be a standalone unit or may be integrated to the electronic converter or any other unit of the power generation system, as may reduce installation and/or handling costs.

In example embodiments, a controller 40 may be responsive to the respective signal from opto-electrical circuitry 22 and may be configured to perform a control strategy for the array of components taking into account the shadow condition that may be present over the one or more of the respective locations of the field. In one example embodiment, the control strategy for the array of components may be configured to adaptively control circuit interconnectivity for at least some of the array of components. For example, the series-circuit and/or parallel circuit connectivity for at least some of PV modules 12 may be dynamically reconfigured based on the shadow condition over one or more of the respective locations of the field. In one example embodiment, inverter control strategy may be adapted based on the shadow condition over one or more of the respective locations of the field. For example, the inverter control strategy may be adapted to more appropriately handle changed characteristics of the current-voltage (I-V) and power-voltage (P-V) curves of PV modules that may be experiencing a shadow condition. Accordingly, it will be appreciated that the control strategy performed by controller 40 may not eliminate the shadow condition (e.g., one may not redirect or dissipate the clouds) but may be useful to dynamically adapt operation of one or more units of the power generation system taking into account any such shadow condition. Controller 40 may be implemented as a stand-alone controller or as part of a supervisory control system of the PV plant.

A simple example is provided below for purposes of conceptual explanation. Let us presume a square-shaped field may be mapped into four quadrants (regions) and let us further presume four optical fibers are respectively arranged to sense solar radiance at each of the four different quadrants of the field. When an optical signal has a relatively lower optical intensity (relative to the intensity of the optical signals of the remaining three optical fibers), this example case would likely indicate a shadowing condition for the quadrant associated with the signal having the relatively lower intensity. Similarly, in the example case where two optical signals have a relatively lower optical intensity (relative to the intensity of the optical signals of the remaining two quadrants), this would likely indicate a shadowing condition in the two quadrants associated with the signals having the relatively lower optical intensity. In the example case where all four optical signals have a relatively lower optical intensity (relative to an expected intensity, e.g., expected intensity for a sunny condition), this would likely indicate a shadowing condition for the entire field.

From the foregoing description it should be appreciated that aspects of the present invention result in a cost-effective, fast-response and reliable apparatus for detecting solar radiance variation (e.g., shadows), as may be used in a variety of solar-based power generation systems involving an array of components located over a relatively large surface-area, e.g., a utility-scale solar field.

While only certain features of the invention have been illustrated and described herein, many modifications and changes will occur to those skilled in the art. It is, therefore, to be understood that the appended claims are intended to cover all such modifications and changes as fall within the true spirit of the invention.

It is claimed:

1. A solar-based power generation system comprising:
   an array of components responsive to solar radiance, the components disposed over respective locations on a field;
   a plurality of optical fibers having respective first ends coupled to the array of components and arranged to receive solar radiance, the plurality of optical fibers having respective second ends arranged to output respective optical signals indicative of respective levels of solar radiance over the respective locations of the field;
   opto-electrical circuitry coupled to receive the respective optical signals from the plurality of optical fibers and generate a respective signal indicative of a shadow condition present over at least one or more of the respective locations of the field; and
   a controller responsive to the respective signal from the opto-electrical circuitry and configured to perform a control strategy for the array of components taking into account the shadow condition present over said at least one or more of the respective locations of the field.

2. The solar-based power generation system of claim 1, wherein the array of components comprises an array of photovoltaic modules.

3. The solar-based power generation system of claim 1, wherein the array of components comprises an array of solar collectors.

4. The solar-based power generation system of claim 1, wherein the control strategy for the array of components is configured to adaptively control a circuit interconnectivity of at least some of the array of components.

5. The solar-based power generation system of claim 1, wherein at least some of the plurality of optical fibers have their respective first ends arranged proximate a periphery of the field.

6. The solar-based power generation system of claim 1, wherein said opto-electrical circuitry comprises a data acquisition unit including a main optical junction box coupled to the respective second ends of the plurality of optical fibers.

7. The solar-based power generation system of claim 6, wherein said data acquisition unit further includes a photodetector device responsive to the respective optical signals from the plurality of optical fibers.

8. The solar-based power generation system of claim 7, wherein said opto-electrical circuitry further comprises a processor coupled to the photodetector device to process respective photodetector output signals and generate the respective signal indicative of the shadow condition present over said at least one or more of the respective locations of the field.

9. The solar-based power generation system of claim 1, further comprising a plurality of magnifying lenses optically coupled to the respective first ends of the plurality of optical fibers.

10. In a solar-based power generation system having an array of components responsive to solar radiance, the components disposed over respective locations on a field, apparatus to determine a presence of shadows comprising:
    a plurality of optical fibers having respective first ends coupled to the array of components and arranged to receive solar radiance, the plurality of optical fibers having respective second ends arranged to output respective optical signals indicative of respective levels of solar radiance over the respective locations of the field; and
    opto-electrical circuitry coupled to receive the respective optical signals from the plurality of optical fibers and generate a respective signal indicative of a shadow condition present over at least one or more of the respective locations of the field.

11. The apparatus of claim 10, further comprising a controller responsive to the respective signal from the opto-electrical circuitry and configured to perform a control strategy for the array of components taking into account the shadow condition present over said at least one or more of the respective locations of the field.

12. The apparatus of claim 11, wherein the control strategy for the array of components is configured to adaptively control a circuit interconnectivity of at least some of the array of components.

13. The apparatus of claim 12, wherein said opto-electrical circuitry comprises a data acquisition unit including a main optical junction box coupled to the respective second ends of the plurality of optical fibers.

14. The apparatus of claim 13, wherein said data acquisition unit includes a photodetector device responsive to the respective optical signals from the plurality of optical fibers.

15. The apparatus of claim 14, wherein said opto-electrical circuitry further comprises a processor coupled to the photodetector device to process respective photodetector output signals and generate the respective signal indicative of the shadow condition present over said at least one or more of the respective locations of the field.

16. The apparatus of claim 10, further comprising a plurality of magnifying lenses optically coupled to the respective first ends of the plurality of optical fibers.

17. The apparatus of claim 10, wherein at least some of the plurality of optical fibers have their respective first ends arranged proximate a periphery of the field.

18. The apparatus of claim 10, wherein the array of components is selected from the group consisting of an array of photovoltaic modules and an array of solar collectors.

19. A solar-based power generation system comprising:

an array of photovoltaic modules disposed over respective locations on a field;

a plurality of optical fibers having respective first ends coupled to the array of photovoltaic modules and arranged to receive solar radiance, the plurality of optical fibers having respective second ends to output respective optical signals indicative of respective levels of solar radiance over the respective locations of the field;

a photodetector device responsive to the respective optical signals from the plurality of optical fibers;

a processor coupled to the photodetector device to process respective photodetector output signals and generate a respective signal indicative of a shadow condition present over at least one or more of the respective locations of the field; and a controller responsive to the respective signal from the processor and configured to perform a control strategy for the array of photovoltaic modules taking into account the shadow condition present over said at least one or more of the respective locations of the field.

20. The solar-based power generation system of claim 19, wherein the control strategy for the array of components is configured to adaptively control a circuit interconnectivity of at least some of the array of components.

* * * * *